United States Patent
Hospach et al.

(10) Patent No.: US 8,986,792 B2
(45) Date of Patent: Mar. 24, 2015

(54) METHOD OF APPLYING A THERMAL BARRIER COATING

(71) Applicants: Forschungszentrum Jülich GmbH, Jülich (DE); Sulzer Metco AG, Wohlen (CH)

(72) Inventors: Andreas Hospach, Jülich (DE); Robert Vassen, Herzogenrath (DE); Georg Mauer, Tönisvorst (DE); Karl-Heinz Rauwald, Jülich (DE); Detlev Stöver, Niederzier (DE); Konstantin von Niessen, Buttwil (CH); Malko Gindrat, Wohlen (CH)

(73) Assignees: Oerlikon Metco AG, Wohlen (CH); Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 13/773,687

(22) Filed: Feb. 22, 2013

(65) Prior Publication Data

US 2013/0224432 A1   Aug. 29, 2013

(30) Foreign Application Priority Data

Feb. 23, 2012   (EP) .................................... 12156756

(51) Int. Cl.
   *C23C 4/10*   (2006.01)
   *C23C 4/12*   (2006.01)
   (Continued)

(52) U.S. Cl.
   CPC ............... *C23C 4/127* (2013.01); *C23C 14/027* (2013.01); *C23C 14/083* (2013.01); *C23C 14/228* (2013.01); *C23C 28/30* (2013.01); *B01D 53/22* (2013.01)
   USPC ............ 427/454; 427/446; 427/453; 427/576

(58) Field of Classification Search
   CPC .... C23C 14/027; C23C 4/105; C23C 14/228; C23C 4/127; C23C 28/30; C23C 14/083; H05H 1/26
   USPC .......... 427/454, 453, 446, 562, 564, 569, 576
   See application file for complete search history.

(56) References Cited

U.S. PATENT DOCUMENTS 5,238,752 A    8/1993   Duderstadt et al.
(Continued)

FOREIGN PATENT DOCUMENTS

EP    2354267 A1    8/2011
WO   03087422 A1   10/2003

OTHER PUBLICATIONS

Lang R V et al; "Development of Compositionally Graded Thermal Barrier Coatings Using Ion Assisted Electron Beam Co-Evaporation," International Sampe Metals Conference, Oct. 20, 1992, pp. M266-M277.
(Continued)

*Primary Examiner* — Dah-Wei D Yuan
*Assistant Examiner* — Nga Leung V Law
(74) *Attorney, Agent, or Firm* — Robert S. Green

(57) ABSTRACT

To apply a thermal barrier coating (10), a plasma jet (5) is generated by a plasma torch in a work chamber (2) and is directed to the surface of a substrate (3) introduced into the work chamber, and a ceramic coating material is applied to the substrate surface by means of PS-PVD, wherein the coating material is injected into the plasma jet as a powder and is partly or completely vaporized there. On applying the thermal barrier coating, in a first workstep the feed rate of the injected powder is set so that a large part of the injected powder vaporizes, wherein the coating material condenses from the vapor phase on the substrate surface and forms mixed phases with the material of the substrate surface. In a second workstep, the feed rate of the injected powder it increased by at least a factor of 5, whereby the portion of the powder which vaporizes is reduced and the coating material is deposited in the form of elongate columns which form an anisotropic microstructure and which are aligned substantially perpendicular to the substrate surface.

18 Claims, 2 Drawing Sheets

Figure 1:
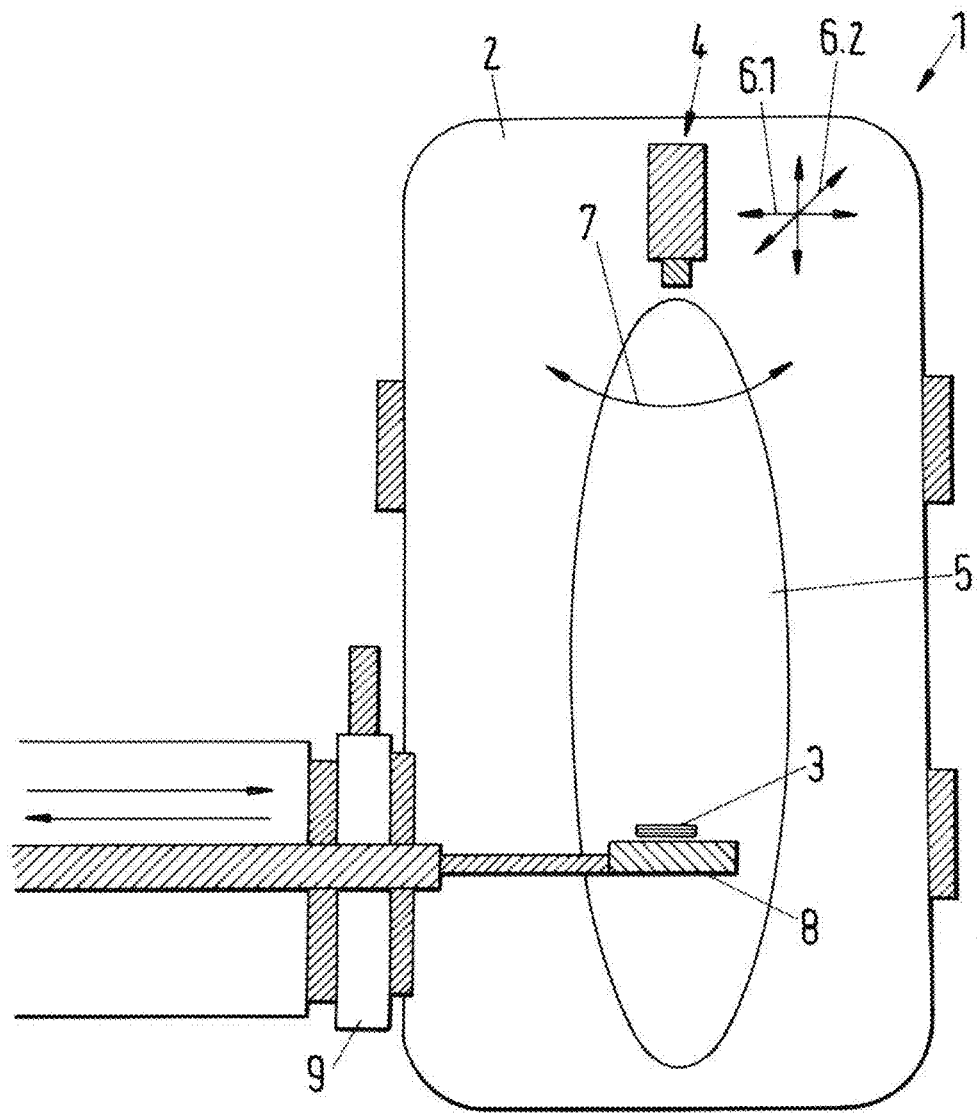

(51) Int. Cl.
  *C23C 14/02* (2006.01)
  *C23C 14/08* (2006.01)
  *C23C 14/22* (2006.01)
  *C23C 28/00* (2006.01)
  *B01D 53/22* (2006.01)

(56) References Cited

U.S. PATENT DOCUMENTS

| 7,678,428 | B2 | 3/2010 | Barbezat et al. | |
|---|---|---|---|---|
| 7,838,083 | B1 | 11/2010 | Youchison et al. | |
| 2005/0129965 | A1* | 6/2005 | Barbezat et al. | 428/469 |

OTHER PUBLICATIONS

Von Niessen L et al; "Vapor Phase Deposition Using Plasma Spray-PVD(TM)," Journal of Thermal Spray Yechnology, ASM, International Materials Park, US, Bd. 19, Nr. 1-2, Jan. 1, 2010, pp. 502-509.

Shinozawa A et al; "Feather-like Structured YSZ Coatings at Fast Rates by Plasma Spray Physical Vapor Deposition," Journal of Thermal Spray Technology, ASM, International Materials Park, US, Bd. 19, Nr. 1-2, Jan. 1, 2010, pp. 190-197.

EP Search Report for Patent Application EP 12156756 dated Jul. 10, 2012.

* cited by examiner

METHOD OF APPLYING A THERMAL BARRIER COATING

The present application claims priority under 35 U.S.C. §119 of European Patent Application No. 12156756.4 filed on Feb. 23, 2012, the disclosure of which is expressly incorporated by reference herein in its entirety.

The invention relates to a method of applying a thermal barrier coating to a substrate surface in accordance with the preamble of claim 1 and to a substrate having such a thermal barrier coating.

Thermal barrier coatings are used in machines and processes to protect parts subject to high thermal strain from the effect of heat, hot gas corrosion and erosion. An increase in the efficiency of machines and processes is frequently only possible with an increase of the process temperature so that exposed parts have to be protected accordingly. The turbine blades in aircraft engines and stationary gas turbines are thus, for example, normally provided with a thermal barrier coating or with a usually multilayer thermal barrier coating system to protect the turbine blades from the effect of the high process temperatures and to extend the servicing intervals and the service life.

A thermal barrier coating system can contain one or more layers in dependence on the application, for example a barrier layer, in particular a diffusion barrier layer, an adhesion promoting layer, a hot gas corrosion protection layer, a protective layer, a thermal barrier coating and/or a cover layer. In the example of the above-mentioned turbine blades, the substrate is usually manufactured from an Ni base alloy or a Co base alloy. The thermal barrier coating system applied to the turbine blade can, for example, contain the following layers in rising order:

- a metallic barrier layer, for example from NiAl phases or NiCr phases or alloys,
- a metallic adhesion promoting layer which also serves as a hot gas corrosion protection layer and which can be manufactured, for example, from a metal aluminide such as NiAl, NiPtAl or PtAl or from an MCrAlY alloy, where M stands for one of the metals Fe, Ni or Co or a combination of Ni and Co,
- an oxide ceramic protective layer, for example predominantly of $Al_2O_3$ or of other oxides;
- an oxide ceramic thermal barrier coating, for example of stabilized zirconium oxide; and
- an oxide ceramic smoothing layer or cover layer, for example of stabilized zirconium oxide or $SiO_2$.

The thermal barrier coating whose manufacture will be explained in the following contains one or more layers of ceramic coating material. The thermal barrier coating is applied to a substrate surface which, as in the example of the above-mentioned turbine blade, can be provided by a metallic adhesion promoting layer and/or a hot gas corrosion protection layer.

If the oxide ceramic thermal barrier coating is applied by means of atmospheric plasma spraying (APS), the coating material melted on solidifies at the substrate surface and as a rule forms a lamellar layer. Lamellar thermal barrier coatings which are applied by means of APS have the disadvantage that they have a comparatively low stretch tolerance and tend to peeling under cyclic thermal strain.

In document U.S. Pat. No. 5,238,752 the manufacture of a thermal barrier coating system is described which is applied to a metallic substrate surface. The substrate itself consists of an Ni alloy or Co alloy, whereas the metallic substrate surface is formed by a 25 µm thick to 125 µm thick adhesion promoting layer of Ni aluminide or Pt aluminide. An oxide ceramic protective layer, 0.03 µm to 3 µm thick of $Al_2O_3$ is generated on this substrate surface by thermal oxidation and an oxide ceramic thermal barrier coating, 125 µm to 725 µm thick, of $ZrO_2$ and 6%-20% by weight $Y_2O_3$ is subsequently deposited by means of electron beam physical vapor deposition (EB-PVD). In the EB-PVD process, the substance to be deposited for the thermal barrier coating, e.g. $Zr_2$ with 8% $Y_2O_3$ is brought into the vapor phase by an electron beam in a high vacuum and is condensed from said vapor phase on the component to be coated. If the process parameters are selected in a suitable manner, a columnar microstructure results.

Due to the columnar layer growth, the thermal barrier coatings manufactured in this way have a comparatively high stretch tolerance under cyclic thermal strain so that the service life of the thermal barrier coatings can be increased.

The manufacture of a thermal barrier coating structure described in U.S. Pat. No. 5,238,752, however, has the disadvantage that the plant costs for the application of the thermal barrier coatings by means of EB-PVD are comparatively high and the application speed is low so that thermal barrier coatings applied by means of EB-PVD are comparatively expensive.

It is known from WO 03/087422 A1 that thermal barrier coatings can also be manufactured with a columnar structure by means of an LPPS thin-film process. In the plasma spray process described in WO 03/087422 A1, a material to be coated is sprayed onto a surface of a metallic substrate by means of a plasma jet. In this respect, the coating material is injected into a plasma defocusing the powder jet and is partly or completely melted there at a low process pressure, which is smaller than 10 kPa. For this purpose, a plasma with a sufficiently high specific enthalpy is generated, so that a substantial portion, amounting to at least 5% by weight, of the coating material changes into the vapor phase. An anisotropic structured layer is applied to the substrate with the coating material. In this layer, elongate corpuscles, called columns in the following, which form anisotropic microstructures are aligned standing largely perpendicular to the substrate surface, wherein the columns are delineated from one another by low-material transition regions and consequently form a columnar structure.

The plasma spray process described in WO 03/087422 A1 for manufacturing thermal barrier coatings having a columnar structure is mentioned in connection with LPPS thin-film processes since, like these, it uses a wide plasma jet which arises by the pressure difference between the pressure in the interior of the plasma torch of typically 100 kPA and the pressure in the work chamber of less than 10 kPa. Since, however, the thermal barrier coatings generated using the described process can be up to 1 mm thick or thicker and are thus practically not covered by the term "thin film", the described method will in the following be called a plasma spray physical vapor deposition process or in abbreviation PS-PVD process.

It is the object of the invention to provide a method of applying a thermal barrier coating which is more economic with respect to EB-PVD processes, with the adhesive strength of the applied thermal barrier coating on the substrate surface and the stretch tolerance under cyclic thermal strain being comparable with the adhesive strength and stretch tolerance of thermal barrier coatings which were applied by means of EB-PVD. A further object is to provide a substrate or a workpiece having such a thermal barrier coating.

This object is satisfied in accordance with the invention by the method defined in claim 1 and by the substrate and workpiece defined in claim 10.

In the method in accordance with the invention of manufacturing a thermal barrier coating on a substrate surface, a work chamber is provided having a plasma torch, a plasma jet is generated, for example, in that a plasma gas is conducted through the plasma torch and is heated therein, for example, by means of electrical gas discharge or electromagnetic induction or microwaves, and the plasma jet is directed to the surface of a substrate introduced into the work chamber. Furthermore, in the method a ceramic coating material is applied to the substrate surface by means of plasma spray physical vapor deposition or PS-PVD in abbreviation, with the coating material being injected into the plasma jet as a powder and being partly or completely vaporized there.

In addition, on the application of the thermal barrier coating, the feed rate of the injected powder is set in a first workstep so that a large part of the injected powder vaporizes, in particular so that more than 80% by weight of the injected powder vaporizes, or the injected powder almost completely vaporizes, and/or so that the applied layer substantially does not have any splats or nanoscale clusters, with the coating material condensing from the vapor phase on the substrate surface, i.e. is mainly deposited as atoms and/or molecules and forms mixed phases with the material of the substrate surface. Subsequently, in a second workstep, the feed rate of the injected powder is increased by at least a factor of 3, in particular by at least a factor of 5 or by at least a factor of 10, whereby the relative portion of the injected powder which vaporizes is reduced and the coating material is deposited in the form of elongate columns which form an anisotropic microstructure and which are aligned substantially perpendicular to the substrate surface.

If the portion of the injected powder which is vaporized or which forms nanoscale clusters is too low, so-called splats are observed on the applied layer as a rule, i.e. delineated regions of solidified splashes of the coating material. This effect occurs in an amplified manner when a mixture of Ar and $H_2$ is used as the plasma gas.

The substrate surface and/or the substrate thereunder is typically metallic, with the substrate being able to be produced from a super alloy and with the substrate surface, for example, being able to be formed by an adhesion promoting layer and/or a hot gas corrosion protection layer, for example by a layer of a metal aluminide such as NiAl, NiPtAl or PtAl or an alloy of the type MCrAlY, where M=Fe, Co, Ni or NiCo. If required, the adhesion promoting layer and/or the hot gas corrosion protection layer can be applied to the substrate surface before the above-described thermal barrier coating by means of a plasma spray process or by means of another suitable process.

If required, the substrate surface can be formed by an oxide layer, for example by a thermal oxide layer containing $Al_2O_3$ or $Al_2O_3+Y_2O_3$ or consisting of $Al_2O_3$ or $Al_2O_3+Y_2O_3$ and/or by an oxide layer which is applied to an adhesion promoting layer and/or to a hot gas corrosion protection layer. The oxide layer can, for example, be thermally generated in the work chamber in that oxygen or a gas containing oxygen is introduced into it and the substrate surface is heated by the plasma jet, for example. The generated oxide layer advantageously contains a high portion of $\alpha$-$Al_2O_3$ which is thermally stable under the conditions of use of the substrate.

The oxide layer can also be generated by means of PS-PVD or by means of a chemical process, for example by means of a plasma spray chemical vapor deposition (PS-CVD), wherein the pressure in the work chamber typically lies below 1 kPa and wherein, as required, at least one reactive component is injected into the plasma jet in solid and/or liquid and/or gaseous form.

The ceramic coating material advantageously contains oxide ceramic components, with the ceramic coating material being able to consist of, for example, stabilized zirconium oxide, for example zirconium oxide stabilized with yttrium, cerium, scandium, dysprosium or gadolinium and/or being able to contain stabilized zirconium oxide, for example zirconium oxide stabilized with yttrium, cerium, scandium, dysprosium or gadolinium as a component.

In an advantageous embodiment of the method, the feed rate of the injected powder is increased stepwise in the second workstep.

In a further advantageous embodiment, the feed rate of the injected powder amounts to 0.5 g/min to 5 g/min in the first workstep and/or at least 5 g/min, typically 8 g/min to 30 g/min, in the second workstep.

In a further advantageous embodiment, the duration of the first workstep amounts to at most 10%, in particular at most 5% or at most 3%. It is advantageous independently of this if the duration of the first workstep amounts to at least 0.5%, in particular at least 1% or at least 2%, of the duration of the second workstep.

In a further advantageous embodiment, the thermal barrier coating which is applied during the first workstep and which contains the mixed phases is 0.1 µm to 10 µm thick, in particular 0.5 µm to 5 µm thick.

In a further advantageous embodiment, the direction of the plasma jet and/or the position of the plasma torch is/are controlled with respect to the substrate. In this manner, the plasma jet can be conducted over the substrate surface on the preheating of the substrate surface or on the application of the thermal barrier coating.

The thermal barrier coating is advantageously applied at a pressure in the work chamber of less than 5 kPa and typically less than 2 kPa or less than 1 kPa by means of PS-PVD, with the coating material usually being injected into a plasma defocusing the powder jet and with the coating material at least partly vaporizing in the plasma jet or forming nanoscale clusters so that, for example, at least 30% by weight or at least 50% by weight changes into the vapor phase to generate a thermal barrier coating having a columnar structure.

The invention furthermore includes a substrate or a workpiece having a ceramic thermal barrier coating which was applied using the above-described method or one of the above-described embodiments and embodiment variants.

The substrate surface and/or the substrate lying thereunder is/are typically metallic, with the substrate being able to be produced from a super alloy and with an adhesion promoting layer and/or a hot gas corrosion protection layer being able to be provided between the substrate surface and the thermal barrier coating, in particular a layer of an alloy of the type MCrAlY, where M=Fe, Co, Ni or NiCo or of a metal aluminide.

If required, an oxide layer can be provided between the substrate surface and the thermal barrier coating, for example a thermal oxide layer containing $Al_2O_3$ or $Al_2O_3+Y_2O_3$ or consisting of $Al_2O_3$ or $Al_2O_3+Y_2O_3$ and/or an oxide layer which is applied onto an adhesion promoting layer and/or onto a hot gas corrosion protection layer.

In an advantageous embodiment, the thermal barrier coating contains a zone having mixed phases toward the substrate surface and a zone having elongate columns toward the surface of the thermal coating, said elongate columns forming an anisotropic microstructure and being aligned substantially perpendicular to the substrate surface, with the thermal barrier coating consisting to a larger part of the zone with elongate columns.

In a further advantageous embodiment, the zone with mixed phases has a thickness of 0.1 μm to 10 μm, advantageously 0.5 μm to 5 μm, and the zone having elongate columns has a thickness of 20 μm to 2000 μm, advantageously 100 μm to 1500 μm.

The decisive difference between the above-described method and conventional coating processes is the possibility of setting a low growth rate (as in EB-PDV) at the start of the layer deposition and subsequently of depositing the large part of the thermal barrier coating as a columnar layer at a high to very high growth rate. The slow layer deposition at the start allows an increased bonding of the thermal barrier coating to the adhesion promoting layer or to the oxide layer by the formation of $Al_2O_3$—$Y_2O_3$—$ZrO_2$ mixed phases. The powder is almost completely vaporized by the introduction of relatively little powder (0.5 g/min to 5 g/min) into the plasma and a deposition of mainly atoms or molecules results. The high growth rates allow a fast and thus inexpensive layer deposition. The powder is no longer completely vaporized due to the introduction of more powder (5 g/min to 40 g/min) into the plasma and a deposition of mainly clusters of 2 nm to 20 nm in size results from which columnar structures are formed. These windows can be displaced in dependence on the powder particle size used and on the plasma torch power.

The method of applying a thermal barrier coating and the substrate or workpiece in accordance with the present invention have the advantage that the thermal barrier coating can be applied less expensively than with conventional EB-PVD processes and simultaneously the adhesive strength of the applied thermal barrier coating on the substrate surface and the stretch tolerance with respect to cyclic thermal strain can be improved with respect to thermal barrier coatings manufactured using conventional PS-PVD processes.

The above description of embodiments and embodiment variants only serves as an example. Further advantageous embodiments can be seen from the dependent claims and from the drawing. Furthermore, individual features from the embodiments and embodiment variants described or shown can also be combined with one another within the framework of the present invention to form new embodiments.

Figure 2:
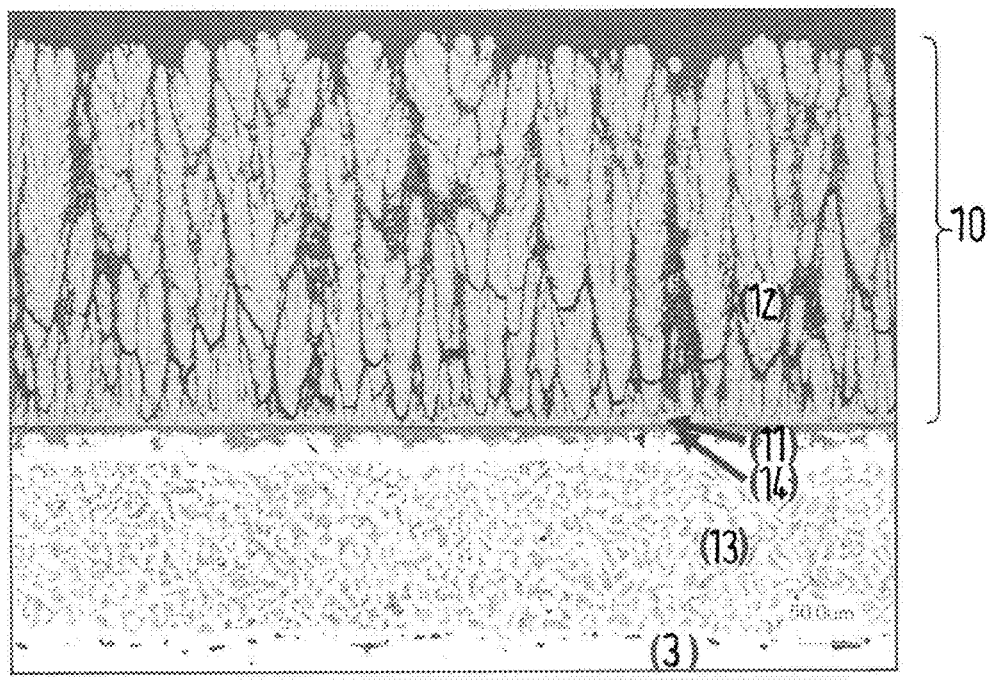
Figure 3:
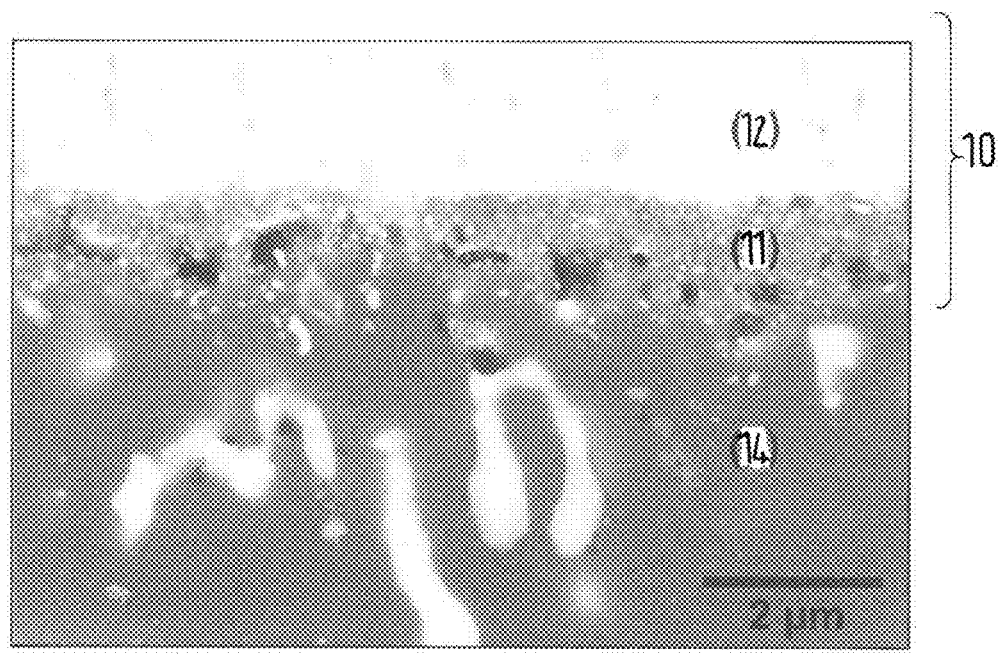

The invention will be explained in more detail in the following with reference to the embodiments and to the drawing. There are shown:

FIG. 1 an embodiment of a plasma coating plant for applying a thermal barrier coating in accordance with the present invention;

FIG. 2 a cross-section through an embodiment of a thermal barrier coating structure having a thermal barrier coating in accordance with the present invention after 2700 temperature cycles; and FIG. 3 a cross-section through a further embodiment of a thermal barrier coating structure having a thermal barrier coating in accordance with the present invention after 1000 temperature cycles.

FIG. 1 shows an embodiment of a plasma coating plant for applying a thermal barrier coating in accordance with the present invention. The plasma coating plant 1 includes a work chamber 2 having a plasma torch 4 for generating a plasma jet 5, a controlled pump apparatus which is not shown in FIG. 1 and which is connected to the work chamber 2 to set the pressure in the work chamber, and a substrate holder 8 for holding the substrate 3. The plasma torch 4, which can be designed, for example, as a DC plasma torch, advantageously has a supplied electric power of at least 60 kW or at least 80 kW or at least 100 kW to generate a plasma with sufficiently high specific enthalpy so that thermal barrier coatings can be manufactured with a columnar structure. The pressure in the work chamber 2 is expediently settable between 2 Pa and 100 kPa or between 5 Pa and 20 kPa. As required, the plasma coating plant 1 can additionally include one or more injection apparatus to inject one or more components in solid, liquid and/or gaseous form into the plasma or into the plasma jet.

Typically, the plasma torch is connected to a power supply, for example to a DC current supply for a DC plasma torch, and/or to a cooling apparatus and/or to a plasma gas supply and on a case by case basis to a supply for spray powder. The process gas or plasma gas can, for example, contain argon, nitrogen, helium or hydrogen or a mixture of Ar or He with nitrogen and/or hydrogen or can consist of one or more of these gases.

In an advantageous embodiment variant, the substrate holder 8 is designed as a displaceable bar holder to move the substrate from an antechamber through a sealing lock 9 into the work chamber 2. The bar holder additionally makes it possible to rotate the substrate, if necessary, during the treatment and/or coating.

In a further advantageous embodiment variant, the plasma coating plant 1 additionally includes a controlled adjustment apparatus for the plasma torch 4, which is not shown in FIG. 1, to control the direction of the plasma jet 5 and/or the spacing of the plasma torch from the substrate 3, for example in a range from 0.2 m to 2 m or 0.3 m to 1.2 m. On a case by case basis, one or more pivot axes can be provided in the adjustment apparatus to carry out pivot movements 7. The adjustment apparatus can furthermore also include additional linear adjustment axes 6.1, 6.2 to arrange the plasma torch 4 over different regions of the substrate 3. Linear movements and pivot movements of the plasma torch allow a control of the substrate treatment and substrate coating, for example to preheat a substrate uniformly over the total surface or to achieve a uniform layer thickness and/or layer quality on the substrate surface.

An embodiment of the method in accordance with the invention of applying a thermal barrier coating 10 to a substrate surface will be described in the following with reference to FIGS. 1, 2 and 3. In the method, a work chamber 2 having a plasma torch 4 is provided, a plasma jet 5 is generated, for example in that a plasma gas is conducted through the plasma torch and is heated therein, for example, by means of electric gas discharge or electromagnetic induction or microwaves, and the plasma jet 5 is directed onto the surface of a substrate 3 introduced into the work chamber. Furthermore, in the method a ceramic coating material is applied to the substrate surface by means of plasma spray physical vapor deposition or PS-PVD in abbreviation, with the coating material being injected into the plasma jet 5 as a powder and being partly or completely vaporized there.

In addition, on the application of the thermal barrier coating 10, the feed rate of the injected powder is set in a first workstep so that a large part of the injected powder vaporizes, in particular so that more than 80% by weight of the injected powder vaporizes, or the injected powder almost completely vaporizes, and/or so that the applied layer substantially does not have any splats or nanoscale clusters, with the coating material condensing from the vapor phase on the substrate surface, i.e. being mainly deposited as atoms and/or molecules, and forms mixed phases with the material of the substrate surface. In a second workstep, the feed rate of the injected powder is increased by at least a factor of 3, in particular by at least a factor of 5 or by at least a factor of 10, whereby the relative portion of the injected powder which vaporizes is reduced and the coating material is deposited in the form of elongate columns which form an anisotropic microstructure and which are aligned substantially perpendicular to the substrate surface.

The substrate surface and/or the substrate 3 lying thereunder is typically metallic, with the substrate being able to be made from a super alloy and with the substrate surface, for example, being able to be formed by an adhesion promoting layer and/or a hot gas corrosion protection layer, for example by a layer of a metal aluminide such as NiAl, NiPtAl or PtAl or an alloy of the type MCrAlY, where M=Fe, Co, Ni or NiCo. If required, the adhesion promoting layer and/or the hot gas corrosion protection layer 13 can be applied to the substrate surface before the above-described thermal barrier coating 10 by means of a plasma spray process or by means of another suitable process.

If required, the surface roughness of the substrate 3 can previously be increased (e.g. by sandblasting) to improve the bonding. After the application of the adhesion promoting layer and/or of the hot gas corrosion protection layer 13, the surface roughness is usually reduced (e.g. by mechanical grinding/polishing). For the better bonding of the adhesion promoting layer and/or of the hot gas corrosion protection layer to the substrate, the latter can subsequently be heat treated under vacuum ($<10^{-4}$ mbar) (also called diffusion annealing). In this respect, strains are reduced, elements are distributed more homogeneously and a chemical bond arises between the substrate and the layer. Uniformly distributed β and γ phases typically form within the adhesion promoting layer and/or the hot gas corrosion protection layer and oxide crystals (e.g. $Y_2O_3$) can grow at the surface if the adhesion promoting layer and/or the hot gas corrosion protection layer consists/consist of an alloy of the type MCrAlY.

As required, in addition a barrier layer can be provided between the substrate 3 and the adhesion promoting layer and/or the hot gas corrosion protection layer 13 (not shown in FIGS. 2 and 3), wherein the barrier layer is advantageously formed as metallic and can, for example, contain NiAl or NiCr.

The substrate surface can also be formed by an oxide layer 14, for example an oxide layer which contains $Al_2O_3$ or $Al_2O_3+Y_2O_3$ or consists of $Al_2O_3$ or $Al_2O_3+Y_2O_3$. The oxide layer is advantageously applied to the adhesion promoting layer and/or to the hot gas corrosion protection layer 13.

The oxide layer 14 can, for example, be produced thermally in the work chamber 2 at a surface temperature of 1000° C. to 1150° C. in that oxygen or gas containing oxygen is conducted into the work chamber and the substrate surface is heated by the plasma jet 5, for example.

In this respect, if the adhesion promoting layer and/or the hot gas corrosion protection layer 13 consists of an alloy of the type MCrAlY, a thin, closed $Al_2O_3+Y_2O_3$ (also called thermally grown oxide or TGO) grows with a high portion of $\alpha$-$Al_2O_3$ which is thermally stable under the conditions of use of the substrate. In this respect, the $Y_2O_3$ crystals grown in vacuum at the surface during the thermal treatment typically grow both into the adhesion promoting layer and/or the hot gas corrosion protection layer 13 and into the TGO layer 14 and form elongate rods. They contain $Al_2O_3$—$Y_2O_3$ mixed phases in the marginal region and reduce the creation of cracks and/or the crack growth between the adhesion promoting layer and/or the hot gas corrosion protection layer and the TGO layer due to the anchorage in the adhesion promoting layer. The Y segregation in the grain borders slows down the oxygen diffusion and thus the TGO growth.

The oxide layer 14 can also be generated by means of PS-PVD or by means of a chemical process, for example by means of a plasma spray chemical vapor deposition (PS-CVD), wherein the pressure in the work chamber typically lies below 1 kPa and wherein, as required, at least one reactive component is injected into the plasma jet in solid and/or liquid and/or gaseous form.

The thermal barrier coating 10 is advantageously applied directly after the oxide layer 14 and/or the oxide layer 14 is formed at least partly during the first workstep on the application of the thermal barrier coating.

The ceramic coating material advantageously contains oxide ceramic components, with the ceramic coating material being able to consist of, for example, stabilized zirconium oxide, for example zirconium oxide stabilized with rare earths and/or being able to contain stabilized zirconium oxide as a component. The substance used as a stabilizer is expediently added to the zirconium oxide in the form of an oxide of rare earths, for example an oxide of yttrium, cerium, scandium, dysprosium or gadolinium, wherein in the case of yttrium oxide the portion advantageously amounts to 5 to 20% by weight and typically to 6 to 10% by weight.

In an advantageous embodiment of the method, the feed rate of the injected powder is increased step-wise in the second workstep.

In a further advantageous embodiment, the feed rate of the injected powder amounts to 0.5 g/min to 5 g/min in the first workstep and/or at least 5 g/min, typically 8 g/min to 30 g/min, or 40 g/min. in the second workstep.

In a further advantageous embodiment, the duration of the first workstep amounts to at most 10%, in particular at most 5% or at most 3%. It is advantageous independently of this if the duration of the first workstep amounts to at least 0.5%, in particular at least 1% or at least 2% of the duration of the second workstep.

In a further advantageous embodiment, the thermal barrier coating 10 which is applied during the first workstep and which contains the mixed phases is 0.1 μm to 10 μm thick, in particular 0.5 μm to 5 μm thick.

In a further advantageous embodiment, the direction of the plasma jet 5 and/or the position of the plasma torch 4 is/are controlled with respect to the substrate. In this manner, the plasma jet 10 can be conducted over the substrate surface on the preheating of the substrate surface or on the application of the thermal barrier coating.

Before the application and/or generation of the layers described in the above embodiments and embodiment variants, the substrate 3 and/or the substrate surface is/are normally preheated to improve the adhesion of the layers. The preheating of the substrate can take place by means of a plasma jet, wherein the plasma jet 5, which contains neither coating powder nor reactive components for the preheating, is conducted over the substrate with pivot movements.

The thermal barrier coating 10 is advantageously applied at a pressure in the work chamber of less than 5 kPa and typically less than 2 kPa or less than 1 kPa by means of PS-PVD, with the coating material usually being injected into a plasma defocusing the powder jet and with the coating material at least partly vaporizing in the plasma jet so that, for example, at least 15% by weight or at least 20% by weight change into the vapor phase to generate a thermal barrier coating having a columnar structure.

The thermal barrier coating 10 can in this respect be built up by depositing a plurality of layers. The total layer thickness of the thermal barrier coating 10 typically has values between 50 μm and 2000 μm, and preferably values of at least 100 μm.

So that the powder jet is reshaped by the defocusing plasma during the PS-PVD process into a cloud of vapor and particles from which a layer with the desired columnar structure results, the powder particles of the coating material must have a very fine grain. The size distribution of the coating material advantageously lies to a substantial extent in the range between 1 μm and 50 μm, preferably between 3 μm and 25 μm, with the powder particles being able to be agglomerates, for example, which are formed from primary particles of typically 0.02 μm to 3 μm in size.

The invention further includes a substrate or workpiece 3 having a ceramic thermal barrier coating 10 which was applied using the above-described method or using one of the above-described embodiments and embodiment variants, with the substrate being able to be a turbine blade made of an Ni or Co base alloy, for example.

The substrate surface and/or the substrate 3 lying thereunder is/are typically metallic, with the substrate being able to be produced from a super alloy and with an adhesion promoting layer 10 and/or a hot gas corrosion protection layer 13 being able to be provided between the substrate surface and the thermal barrier coating 10, in particular a layer of an alloy of the type MCrAlY, where M=Fe, Co, Ni or NiCo or of a metal aluminide.

If required, an oxide layer 14 can be provided between the substrate surface and the thermal barrier coating 10, for example a thermal oxide layer containing $Al_2O_3$ or $Al_2O_3+Y_2O_3$ or consisting of $Al_2O_3$ or $Al_2O_3+Y_2O_3$ and/or an oxide layer which is applied to an adhesion promoting layer and/or to a hot gas corrosion protection layer 13.

In an advantageous embodiment, the thermal barrier coating 10 contains a zone 11 having mixed phases toward the substrate surface and a zone 12 having elongate columns toward the surface of the thermal coating, said elongate columns forming an anisotropic microstructure and being aligned substantially perpendicular to the substrate surface, with the thermal barrier coating 10 being composed to a larger part of the zone 12 with elongate columns.

In a further advantageous embodiment, the zone 11 having mixed phases has a thickness of 0.1 μm to 10 μm, advantageously 0.5 μm to 5 μm, and the zone 12 having elongate columns has a thickness of 50 μm to 2000 μm, advantageously 100 μm to 1500 μm.

FIG. 2 shows a cross-section through an embodiment of a thermal barrier coating structure having a thermal barrier coating 10 in accordance with the present invention after 2700 temperature cycles and FIG. 3 shows a cross-section through a further embodiment after 1000 temperature cycles.

In the embodiments shown, the substrate 3 is manufactured from the nickel-based alloy Iconel 738, with the substrate surface being able to be formed, for example, as shown in FIG. 2, by a thermal oxide layer 14 which is composed of $\alpha$-$Al_2O_3$ and $Al_2O_3$—$Y_2O_3$ mixed phases. In the embodiments shown, the oxide layer 14 is applied to an adhesion promoting layer and/or a hot gas corrosion protection layer 13, for example to a layer of an alloy of the type MCrAlY, where M=Fe, Co, Ni or a combination of Ni and Co. The adhesion promoting layer and/or the hot gas corrosion protection layer 13 typically has a thickness between 50 μm and 500 μm.

The thermal barrier coating 10 was applied to the substrate surface using the method in accordance with the present invention. It contains, as shown in FIGS. 2 and 3, a zone 11 surface having $Al_2O_3$—$Y_2O_3$—$ZrO_2$ mixed phases toward the substrate and a zone 12 having elongate columns toward the surface of the thermal barrier coating, said elongate columns forming an anisotropic microstructure and being aligned substantially perpendicular to the substrate surface.

The thermal barrier coatings shown were subjected to a temperature cycle test. In this respect, the thermal barrier coating was heated from the surface using a torch in a 7-minute cycle until the temperature of the thermal barrier coating surface stabilized at 1250° C. and the temperature of the adhesion promoting layer stabilized at 1050° C. and subsequently the substrate rear side was cooled by compressed air until the temperature of the thermal barrier coating surface fell to 100° C. It can easily be recognized from FIGS. 2 and 3 that the thermal barrier coatings 10 applied using the method in accordance with the invention are intact in the regions shown in FIGS. 2 and 3 after the temperature cycle test and that no signs of delamination can be recognized even after 2700 and 1000 temperature cycles thanks to the above-described structure of the thermal barrier coatings.

The invention claimed is:

1. A method of applying a thermal barrier coating (10) to a substrate surface, wherein in the method
   a work chamber (2) having a plasma torch (4) is provided,
   a plasma jet (5) is generated and is directed to the surface of a substrate (3) introduced into the work chamber,
   a ceramic coating material is applied to the substrate surface by means of plasma spray physical vapor deposition or PS-PVD in abbreviation, with the coating material being injected into the plasma jet as a powder and being partly or completely vaporized there,
   wherein
   on the application of the thermal barrier coating (10), the feed rate of the injected powder is set in a first workstep so that at least 80% by weight of the injected powder vaporizes; and/or in that the applied layer has substantially no splats and no nanoscale clusters, in the first workstep, the coating material condenses from the vapor phase on the substrate surface and forms mixed phases with the material of the substrate surface,
   in a second workstep, the feed rate of the injected powder is increased by at least a factor of 3, compared to the feed rate of the injected powder in the first workstep, whereby the relative portion of the injected powder which vaporizes is reduced compared to the relative portion of the injected powder which vaporizes in the first workstep, in the second workstep, the coating material is deposited in the form of elongate columns which form an anisotropic microstructure and which are aligned substantially perpendicular to the substrate surface, and
   the ceramic coating material deposited in the first and second workstep forms the thermal barrier coating.

2. A method in accordance with claim 1, wherein the substrate surface is formed by an adhesion promoting layer and/or a hot gas corrosion protection layer (13).

3. A method in accordance with, claim 1, wherein the substrate surface is formed by at least one of an oxide layer, an oxide layer which is applied to an adhesion promoting layer and to a hot gas corrosion protection layer (13).

4. A method in accordance with claim 1, wherein the substrate (3) is metallic and is in particular produced from a super alloy.

5. A method in accordance with claim 1, wherein the ceramic coating material contains oxide ceramic components and/or wherein the ceramic coating material consists of stabilized zirconium oxide, and/or contains stabilized zirconium oxide as a component.

6. A method in accordance with claim 1, wherein the feed rate of the injected powder is increased stepwise in the second workstep.

7. A method in accordance with claim 1, wherein the feed rate of the injected powder in the first workstep amounts to 0.5 g/min to 5 g/min, and/or wherein the feed rate of the injected powder in the second workstep amounts to 5 g/min to 40 g/min.

8. A method in accordance with claim 1, wherein the duration of the first workstep amounts to at most 10% of the duration of the second workstep.

9. A method in accordance with claim 1, wherein the thermal barrier coating which is applied during the first workstep and which contains the mixed phases is 0.1 µm to 10 µm thick.

10. The method of claim 1, wherein the feed rate of the injected powder is set in the first workstep so that more than 80% by weight of the injected powder vaporizes.

11. The method of claim 1, wherein in the second workstep, the feed rate of the injected powder is increased by at least a factor of 5 compared to the feed rate of the injected powder in the first workstep.

12. The method of claim 1, wherein in the second workstep, the feed rate of the injected powder is increased by at least a factor of 10 compared to the feed rate of the injected powder in the first workstep.

13. The method of claim 2, wherein the substrate surface is formed by a layer of an alloy of the type MCrAlY, where M=Fe, Co, Ni or NiCo, or of a metallic aluminide.

14. The method of claim 3, wherein the substrate surface is formed by a thermal oxide layer containing $Al_2O_3$ or $Al_2O_3 + Y_2O_3$ or consisting of $Al_2O_3$ or $Al_2O_3 + Y_2O_3$.

15. The method of claim 5, wherein the ceramic coating material consists of zirconium oxide stabilized with yttrium, cerium, scandium, dysprosium or gadolinium.

16. The method of claim 1, wherein the ceramic coating material contains zirconium oxide stabilized with yttrium, cerium, scandium, dysprosium or gadolinium, as a component.

17. The method of claim 1, wherein the duration of the first workstep amounts to at least 1% of the duration of the second workstep.

18. The method of claim 9, wherein the thermal barrier coating applied during the first workstep and which contains the mixed phases is 0.5 µm to 5 µm thick.

* * * * *